(12) United States Patent
Colombo et al.

(10) Patent No.: US 8,124,529 B2
(45) Date of Patent: Feb. 28, 2012

(54) SEMICONDUCTOR DEVICE FABRICATED USING A METAL MICROSTRUCTURE CONTROL PROCESS

(75) Inventors: Luigi Colombo, Dallas, TX (US); James J. Chambers, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1027 days.

(21) Appl. No.: 11/421,671

(22) Filed: Jun. 1, 2006

(65) Prior Publication Data

US 2007/0278584 A1      Dec. 6, 2007

(51) Int. Cl.
*H01L 21/44*     (2006.01)
(52) U.S. Cl. ......... 438/658; 438/585; 438/660; 438/663
(58) Field of Classification Search .................. 438/585, 438/658, 660, 663
See application file for complete search history.

(56) References Cited

U.S. PATENT DOCUMENTS

| 6,271,573 | B1 * | 8/2001 | Suguro ..................... 257/407 |
| 7,101,742 | B2 * | 9/2006 | Ko et al. ..................... 438/197 |
| 2004/0201022 | A1 * | 10/2004 | Yamazaki et al. ............. 257/72 |
| 2004/0238883 | A1 * | 12/2004 | Nishinohara et al. ......... 257/330 |
| 2005/0112817 | A1 | 5/2005 | Cheng et al. |
| 2006/0027810 | A1 | 2/2006 | Machida et al. |

FOREIGN PATENT DOCUMENTS

JP          57059381 A    *   4/1982

* cited by examiner

*Primary Examiner* — Matthew E Warren
(74) *Attorney, Agent, or Firm* — Warren L. Franz; Wade J. Brady, III; Frederick J. Telecky, Jr.

(57) ABSTRACT

The invention provides a method for manufacturing a semiconductor device that comprises placing a metallic gate layer over a gate dielectric layer where the metallic gate layer has a crystallographic orientation, and re-orienting the crystallographic orientation of the metallic gate layer by subjecting the metallic gate layer to a hydrogen anneal.

3 Claims, 11 Drawing Sheets

SEMICONDUCTOR DEVICE FABRICATED USING A METAL MICROSTRUCTURE CONTROL PROCESS

TECHNICAL FIELD OF THE INVENTION

The invention is directed in general to semiconductor devices and, more specifically, to a semiconductor device fabricated using a metal microstructure control process.

BACKGROUND

The ability to dope polysilicon gates to different degrees allows one to adjust the work function of gate electrode materials to particular types of metal oxide silicon (MOS) transistors. It is desirable to adjust the work function of a gate electrode or gate, to be close to either the conduction band or the valence band of silicon, because this reduces the threshold voltage ($V_t$) of the transistor, thereby facilitating a high drive current at low operating voltages. Dual work function gates, for example doped polysilicon, are advantageously used in semiconductor devices, such as complementary metal oxide silicon (CMOS) transistor devices, having both pMOS and nMOS transistors. The use of doped polysilicon gates has become problematic, however, as the dimensions of gates and gate insulators alike have significantly reduced.

It is well understood that polysilicon gates can accommodate only a finite amount of dopants. This limitation can result in a depletion of gate charge carriers at the interface between the gate and gate dielectric, when the gate is biased to invert the channel. Consequently, the electrical thickness of the gate stack is substantially increased, thereby deteriorating the performance characteristics of the transistor.

In view of the shortcomings of doped polysilicon, metal gates are an attractive alternative to polysilicon because they have larger supply of charge carriers than doped polysilicon gates. When a metal gate is biased to invert the channel, there is no substantial depletion of carriers at the interface between the metal gate and gate dielectric. Accordingly, the transistor's performance is not deteriorated because the electrical thickness of the gate stack is not increased. In the manufacture of semiconductor devices, having independently adjustable dual work function metal gates has been troublesome, however.

Ideally, dual work function metal gates should be compatible with the type of device in which it will operate. However, during fabrication processes and due primarily to the thermal budgets involved, the work function of each of these metal gates may shift or drift either up or down, thereby changing the work function and consequently, device performance and also changing the $V_t$ uniformity (i.e., the $V_t$ from one device to another).

One of the more challenging aspects of gate electrode work function or threshold voltage control is controlling the gate electrode crystallographic texture. Most metals and metal compounds under consideration for use as metal gates are crystalline, and most crystalline metals have some variation of work function, and therefore, threshold voltage, for certain grain orientations. Thin metal layers may have fairly well or well-oriented grains, but they often are not single orientation. As a result, the work function of the resulting metal may vary from device to device, especially in the case of narrow lines, e.g., sub 30 nm. This non-uniformity can ultimately affect device performance, and is, therefore, undesirable in view of the stringent operating requirements that present day technologies are expected to meet.

Accordingly, what is needed in the art is a semiconductor device that avoids the disadvantages associated with the current manufacturing processes.

SUMMARY OF INVENTION

The invention, in one embodiment, provides a method for manufacturing a semiconductor device that comprises placing a metallic gate layer over a gate dielectric layer where the metallic gate layer has a crystallographic orientation, and re-orienting the crystallographic orientation of the metallic gate layer by subjecting the metallic gate layer to a hydrogen anneal.

In another aspect, the invention provides a method of fabricating an integrated circuit (IC). In one embodiment, the method comprises forming transistors over a semiconductor substrate that comprises forming gate electrodes. The gate electrode may be formed by placing a metallic gate layer over a gate dielectric layer, where the metallic gate layer has a crystallographic orientation, and re-orienting the crystallographic orientation of the metallic gate layer by subjecting the metallic gate layer to a hydrogen anneal. The method further comprises placing dielectric layers over the gate electrodes and forming interconnects within and over the dielectric layers to interconnect the transistors to form an operative integrated circuit.

BRIEF DESCRIPTION OF THE DRAWINGS

The invention is best understood from the following detailed description when read with the accompanying FIGUREs. Reference is now made to the following descriptions taken in conjunction with the accompanying drawings, in which.

DETAILED DESCRIPTION

The invention overcomes previous difficulties in the production of devices having metal gates by providing a process that allows for a more uniform crystal orientation for like devices across the wafer and thereby a more uniform work function for those devices.

The term, work function, is well known and defined as the minimum energy required to bring an electron from the Fermi level to the vacuum level. A gate's work function is typically matched to one of a conduction band or a valence band of a semiconductor substrate when the work function is within about 0.4 eV, and more preferably about 0.2 eV, of the energy level of the substrate's conduction band or valence band. As an example, a gate's work function is matched to a silicon substrate's valence band when the gate work function is greater than about 4.8 eV, and more preferably between about 4.9 and about 5.2 eV. Alternatively a gate's work function is matched to a silicon substrate's conduction band when the gate work function is less than about 4.4 eV and more preferably, between about 4.0 and about 4.3 eV.

The energy levels corresponding to the valence and conduction bands differ depending on the type of material used for the semiconductor substrate and the type and concentration of any dopants in the substrate. One skilled in the art should understand how to determine specific energy level values for the semiconductor substrate of interest and define gate work functions that would match the valence or conduction bands, as appropriate.

Figure 1:
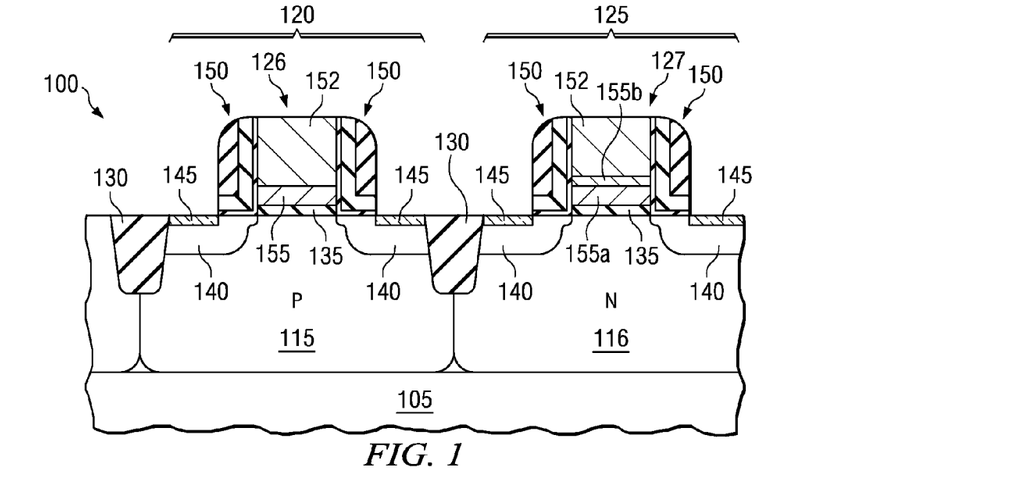
FIG. 1 illustrates a semiconductor device upon completion of the formation of an nMOS transistor and a pMOS transistor having a metal gate electrode with a re-oriented crystal microstructure.

FIG. 1 illustrates a semiconductor device 100 as provided by one embodiment of the invention that has been completed to the pre-metal dielectric stage. The illustrated semiconductor device 100 comprises a semiconductor substrate 105 having a conduction band and a valence band. In some advantageous embodiments, the semiconductor substrate 105 may comprise silicon, although other conventional substrate materials, such as Groups 2 and 14 and Groups 13 and 15 (International Union of Pure and Applied Chemist Convention for designating Groups and Periods) elements may also be used. More specific examples include silicon-on-insulator, germanium on insulator, silicon germanium on insulator, gallium arsenide, germanium, silicon-germanium and silicon carbide substrates. The semiconductor substrate 105 can be a layer located in the partially completed device 100, including a silicon wafer itself or a layer located above the wafer, such as an epitaxial layer, silicon layer of a silicon-on-insulator (SOI) substrate, or other substrate, such as silicon carbide. The semiconductor substrate 105 can be p-type or n-type and, as illustrated in FIG. 1, and may also include a conventional p-type doped well 115 and an n-type doped well 116 in the substrate 105. Of course, other dopant configurations are also within the scope of the invention. As well understood by those skilled in the art, regardless of the type of material and dopant used, the semiconductor substrate 105 has a conduction band and a valence band.

As further illustrated in FIG. 1, the device 100 includes two regions: an nMOS region 120 and a pMOS region 125 in which are located an nMOS transistor 126 and a pMOS transistor 127, which can be doped to form a complementary device as shown. Those skilled in the art understand that for the nMOS transistor 126, the well is p-type doped, while for the PMOS transistor 127, the well is n-type doped. In certain configurations, the dual work function metal gate semiconductor device 100 is a CMOS device. The nMOS transistor 126 and PMOS transistor 127 may be separated by isolation structures 130, such as shallow trench isolation structures. Although the complementary device is illustrated for exemplary purposes, other device configurations well known to those skilled in the art, are also within the scope of the invention.

The nMOS and PMOS transistors 126 and 127 each include a gate dielectric 135, such as a high quality dielectric. The nMOS and pMOS transistors 126 and 127 may also include appropriately doped source/drains 140 located in the respective wells 115 and 116, and silicided contacts 145. Sidewall spacers 150, such as oxide-nitride-oxide spacers may also be present. However, the sidewall spacers need not be multi-layered, as in the illustrated embodiment, and other spacer designs are useful in the invention. Gate electrode structures 152 are located over each of the gate dielectrics 140 and adjacent the source/drains 140 and between the sidewall spacers 150. The gate electrode structures 152 include NMOS and pMOS metal gate electrodes 155, 155a, respectively, formed as described below. In one embodiment, the gate electrode 155a may also include a barrier layer 155b.

Figure 2A:
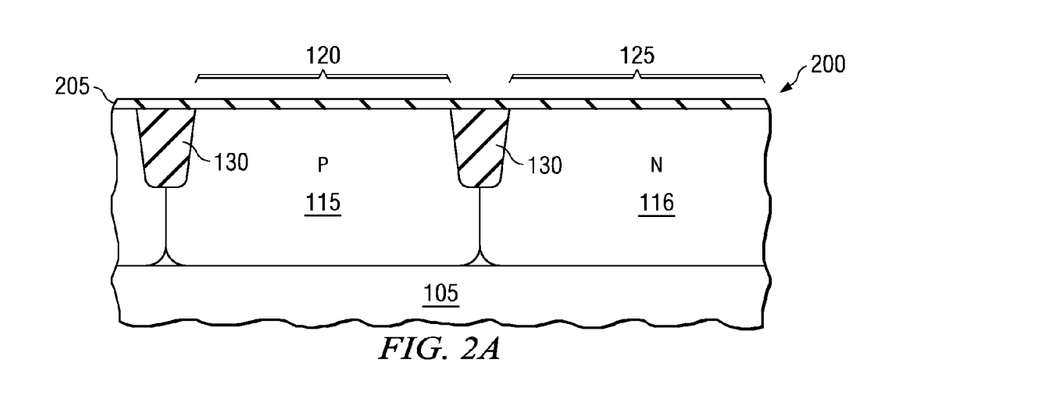
FIGS. 2A-2L illustrate one embodiment of a semiconductor device at various stages of manufacture, as provided by the invention.

FIG. 2A depicts a semiconductor device 200 at a one stage of the manufacture of the semiconductor device 100 of FIG. 1. As seen in this view, a dielectric layer 205 has been formed over the semiconductor substrate 105 and over both the nMOS and pMOS regions 120, 125. In one embodiment, the dielectric layer 205 may be a high quality gate dielectric that can be formed with conventional materials and processes, including atomic layer deposition (ALD), physical vapor deposition (PVD), chemical vapor deposition (CVD), high temperature oxidation process, or other procedures well known to those skilled in the art. In some embodiments, the dielectric layer 205 is formed using a high thermal budget with temperatures in the range between 700 and 1100 degrees Celsius (C) to yield a high quality gate dielectric with low defect and trap densities. It should be noted that the thermal budget (i.e., the total amount of thermal energy, which is proportional to temperature and duration of the process, transferred to the wafer during fabrication) will vary depending on the generation of the technology, inasmuch as thermal budgets have generally declined from one generation to the next. However, typically, the higher thermal budgets will involve the formation of not only the gate dielectric 205 but also the temperatures required to dope and activate the source/drains. Thus, the invention is not limited to any particular generation of technology.

In some embodiments, the dielectric layer 205 may comprise a refractory metal. For the purposes of the invention, a refractory metal is defined as any element in Groups 4 and 6 and Periods 4 and 6 of the Periodic Table of Elements, as well as elements in the Lanthanide and Actinide series. In certain embodiments, the dielectric layer 205 is a high-k dielectric material, that is, a material having a dielectric constant of greater than about 4, and more specifically, between about 6 and about 20. Non-limiting examples include silicon oxynitride, hafnium oxide, hafnium oxynitride, hafnium silicon oxynitride, zirconium oxide, zirconium oxynitride, zirconium silicon oxynitride, titanium oxide, titanium oxynitride, titanium silicon oxynitride or tantalum silicon oxynitride. Other materials well known to those skilled in the art are also within the scope of the invention.

Figure 2B:
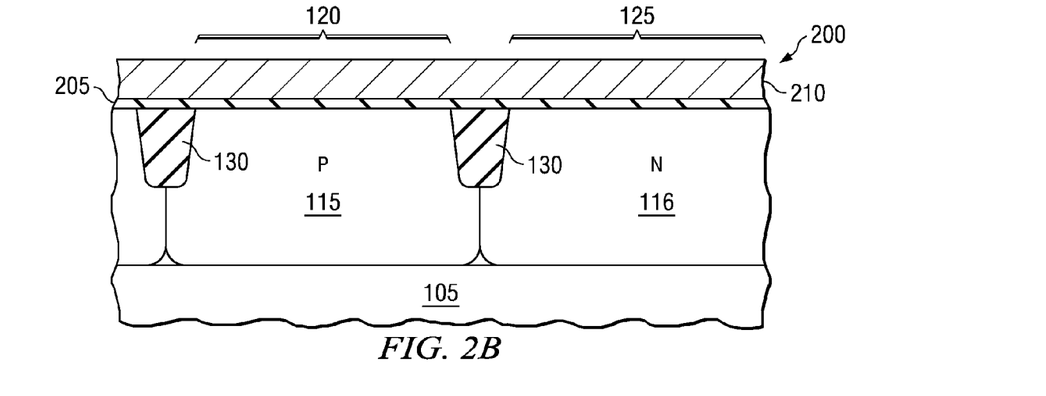

In FIG. 2B a metal layer 210 is deposited over, and in certain embodiments on, the dielectric layer 205. The metallic layer 210 may be formed using any number of conventional deposition processes. For instance, the metallic layer 210 can be deposited using physical vapor deposition (PVD), such as sputtering, atomic layer deposition (ALD), chemical vapor deposition (CVD), or other deposition techniques. The thickness of the metallic layer 210 may vary. In exemplary embodiments, the thickness of the metallic layer 210 may range from about 1.5 nm to about 10 nm.

The work function of the metallic layer 210 can be modified as discussed below to form a portion of the gate electrode structures 126, 127, as depicted in FIG. 1. Various metals and alloys may be employed to form the metallic layer 210, including those whose crystallographic orientation may be changed with a hydrogen anneal. For example, and not by way of limitation, the metallic layer 210 may comprise tungsten, molybdenum, ruthenium, rhenium, cobalt, nickel, platinum, or gold. During deposition, the crystallographic orientation of the polycrystalline metallic layer 210 may vary across the substrate 105. For example, some grains may have a <111> orientation, while others may have a <110> orientation. It is desirable to have the crystal orientation of the metallic layer 215 be as uniform as possible, particularly in the pMOS region 125.

Additionally, in one embodiment, the metallic layer 210 is selected such that its work function can be appropriately modified to the conduction band or the valence band of the semiconductor substrate 105, depending on whether the intended device is an nMOS device or a pMOS device, respectively. An embodiment by which the work function can be modified to the conduction band or valence band is explained below.

Figure 2C:
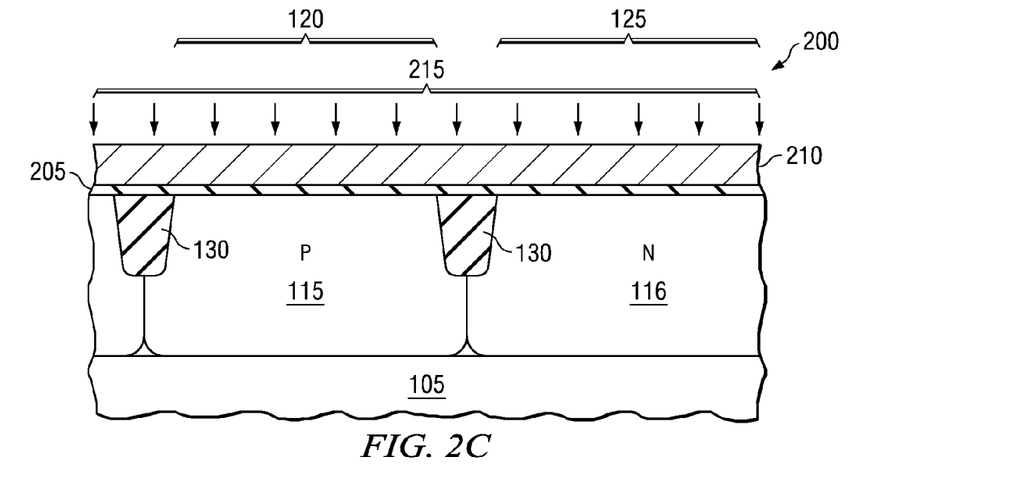

In FIG. 2C the semiconductor device 200 is subjected to a hydrogen anneal 215. In this embodiment, the hydrogen anneal 215 may be conducted in a fashion such that both the nMOS region 120 and the pMOS region 125 are exposed to the anneal 215. However, in other embodiments, the anneal 215 may be selectively performed. While not being bound to any particular theory of operation, it is believed that the hydrogen anneal 215 increases the surface mobility of the atoms in metallic layer 210 and allows re-orientation of the crystal microstructure within the metallic layer 210 to occur. The hydrogen anneal 215, in one embodiment, may comprise a hydrogen gas. In other embodiments, the hydrogen anneal 215 may comprise a mixture of gases, such as $H_2/N_2$, $N_2/Ar$, etc. In such embodiments, the anneal 215 may also include an inert carrier gas, such as $N_2$, Ar, He, Ne, Kr, or Xe. It should also be noted that the invention is also compatible with those devices involving silicon/germanium layers or other strain-inducing layers located at the device level.

Considering the case of tungsten (W) or other body-centered-cubic metals, prior to the anneal 215, the crystallographic orientation of the metallic layer 210 will vary across the device 200, and as such, it will have some <111> crystal orientation component. While, for W, this orientation may be closer to a work function suitable for an nMOS device, it is less desirable for a pMOS device. It has been found with the invention that the hydrogen anneal 215 re-orients the <111> crystal microstructure to a <110> orientation, which is a more desirable and conducive orientation for a pMOS device in that it provides a work function better suited for that type of device.

In addition to re-orienting the crystal microstructure of the metallic layer 210, the hydrogen anneal 215 may also be used to clean the surface of the metallic layer 210. After its deposition, the surface of the metallic layer 210 may oxidize or otherwise be contaminated. In such instances, the hydrogen anneal 215 can be used to reduce the surface of the metal layer 210 to remove any oxide formation that might have occurred on the surface of the metallic layer 210 or to otherwise clean the surface.

In one embodiment, the hydrogen anneal 215 is conducted at a temperature ranging from about 21° C. to about 1250° C., with about 1000° C. being applicable in one embodiment. Hydrogen gas may be used as the source of the hydrogen in the pressure range of 1 millitorr to 1 atmosphere using flow rates ranging from about 1 sccm to about 5000 sccm. The time of the exposure to the anneal 215 may vary depending on whether the anneal 215 is being used to re-orient the microstructure of the metallic layer 210 or clean the surface of the metallic layer 210. For example in one embodiment, the time used to re-orient the metallic layer 210 may range from about 1 millisecond to about 30 minutes, while the time used to clean the metallic layer 210 may range from a 1 second to about one minute. In other embodiments, however, the time to re-orient and clean the metallic layer 210 can be the same.

In another embodiment, the hydrogen anneal 215 may be hydrogen plasma. In one aspect of this embodiment, the power used to generate the hydrogen plasma ranges from about 500 watts to about 3 kilowatts, at a gas flow ranging from about 1 sccm to about 100 sccm, at a pressure ranging from a few millitorrs to a few Torrs, and a temperature ranging from about room temperature to about 800° C. A hydrogen plasma is particularly useful when it is desirable to keep the anneal temperature as low as possible for thermal budget reasons.

Figure 2D:
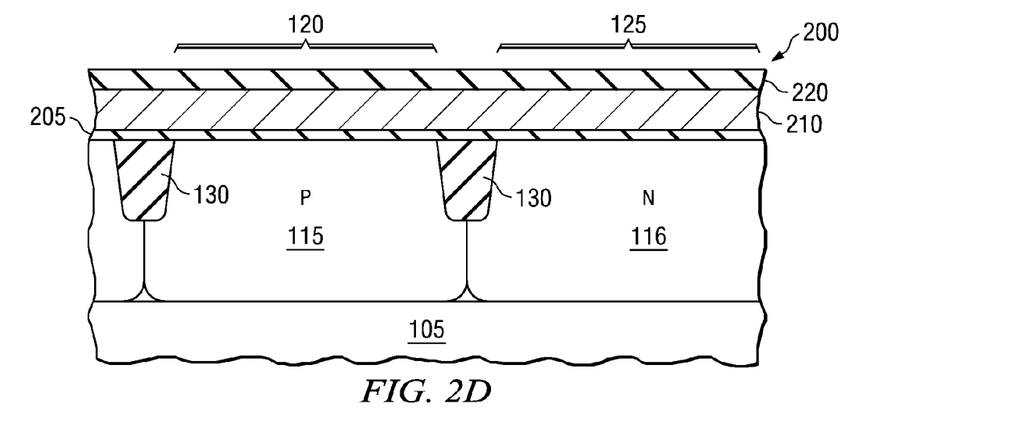

FIG. 2D illustrates one embodiment, where a barrier layer 220 may be deposited following the re-orientation of the metallic layer 210. In this embodiment, the barrier layer 220 is formed across both the nMOS region 120 and PMOS region 125. Conventional processes similar to those used to form the metallic layer 210 may be used to deposit the barrier layer 220. One skilled in the art would be familiar with any number of conventional procedures to form the barrier layer 220.

In one embodiment, the barrier layer 220 may be comprised of a material that deters the reaction between the poly silicon and the underlying metal in addition to preventing unwanted diffusion of dopants into the metallic layer 210. For instance, the barrier layer 220 can thermally decouple and prevent reactions between the metallic layer 210 and an overlying material layer, such as a polysilicon layer, that can occur at elevated temperatures. Suitable barrier materials include metal nitrides, such as tungsten nitride, tantalum nitride or titanium nitride. It is also desirable that the barrier layer 220 be thick enough to deter the diffusion of dopants and other elements into the metallic layer 210. For instance, the barrier layer 210 may have a thickness ranging from about 0.5 nm to about 10 nm. In another embodiment, the thickness may range from about 2 nm to about 5 nm in order to allow polysilicon integration with subsequent contact silicidation and also to minimize gate stack formation difficulties due to the presence of a thick barrier layer during pattern and etch.

Figure 2E:
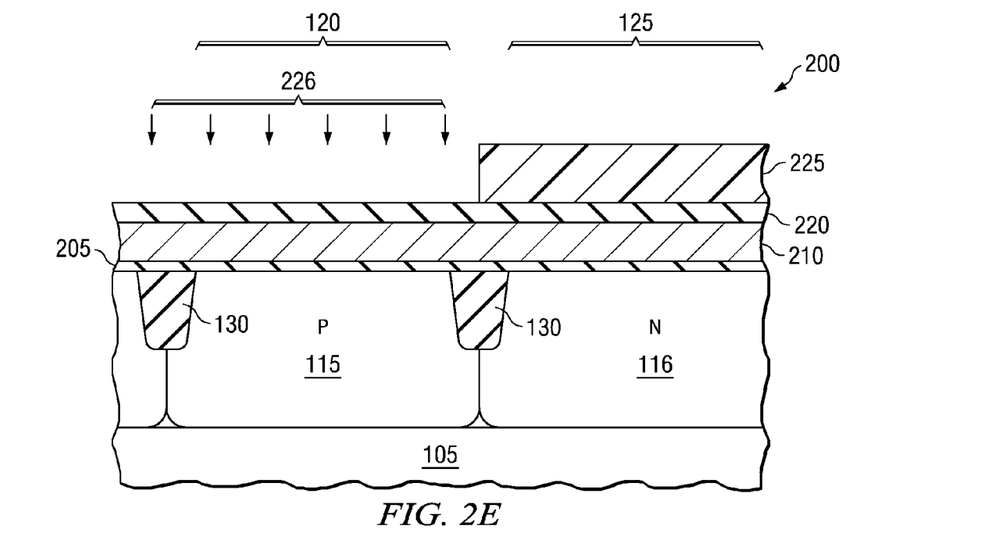

After its deposition, the barrier layer 220, in one embodiment, may be patterned using conventional processes with a mask 225, such as photoresist, to expose the NMOS region 120 and protect the PMOS region 125, as illustrated in FIG. 2E. A conventional etch process 226 may be used to remove the barrier layer 220 from the exposed NMOS region. The re-oriented metallic gate layer 210 in the PMOS region remains unaffected by the etch due to the mask 225.

Figure 2F:
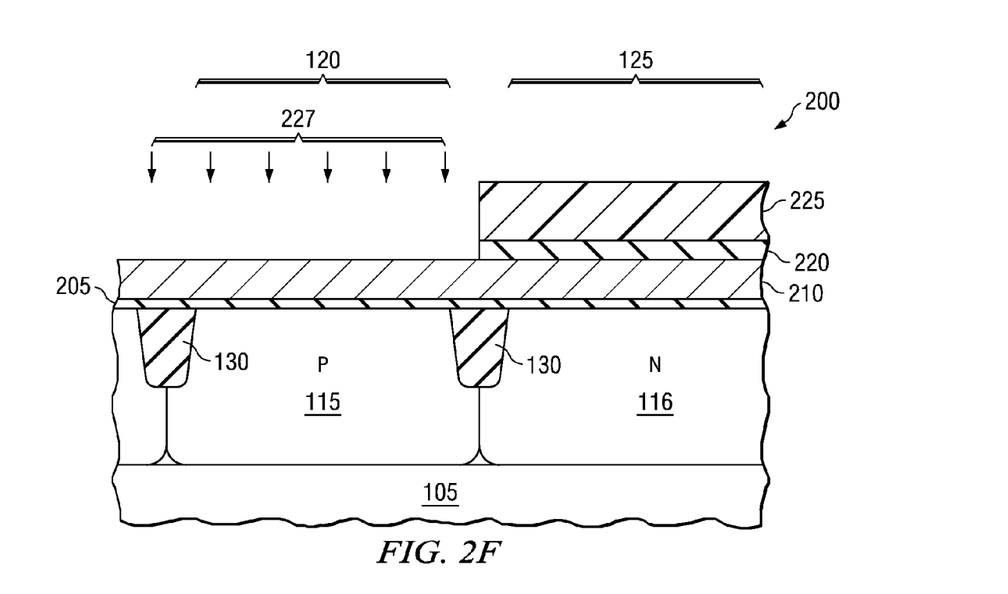
Figure 2G:
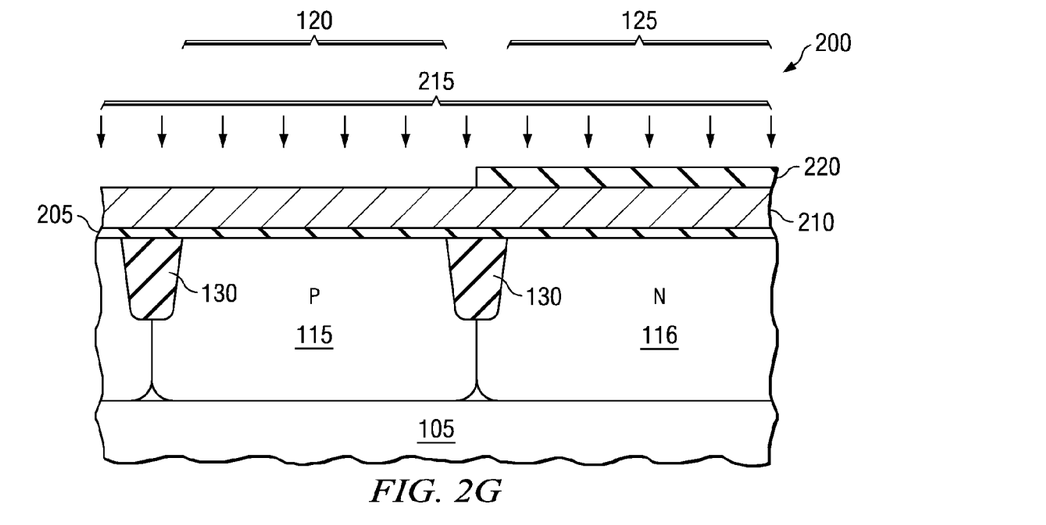

FIG. 2F shows the device 200 after the removal of the barrier layer 220, as explained above. In addition, FIG. 2F illustrates the device 200 undergoing an optional doping process 227 that may be conducted on the nMOS region 120 to adjust the work function of the metal layer 210 in the nMOS region 120. The doping process 227 may be conventional, and the mask 225 may be left in place to protect the re-oriented metallic layer 210 in the PMOS region 125 from the doping process 227. After the doping process 227 is completed, the mask 225 can be removed by using a conventional removal process, resulting in the structure shown in FIG. 2G.

In many cases, oxidants and other particles may be left on the surface of the device 200 after the removal of the mask 225. As further seen in FIG. 2G, in such instances, the previously discussed hydrogen anneal 215 may also be optionally used at this point in the manufacturing process to clean the surface of the device 200. In fact, the invention provides that the hydrogen anneal 215 may be used at any point during the manufacturing process where it is desirable to remove oxidation or clean a contaminated surface and where re-orientation of the metallic layer 210 is useful.

Figure 2H:
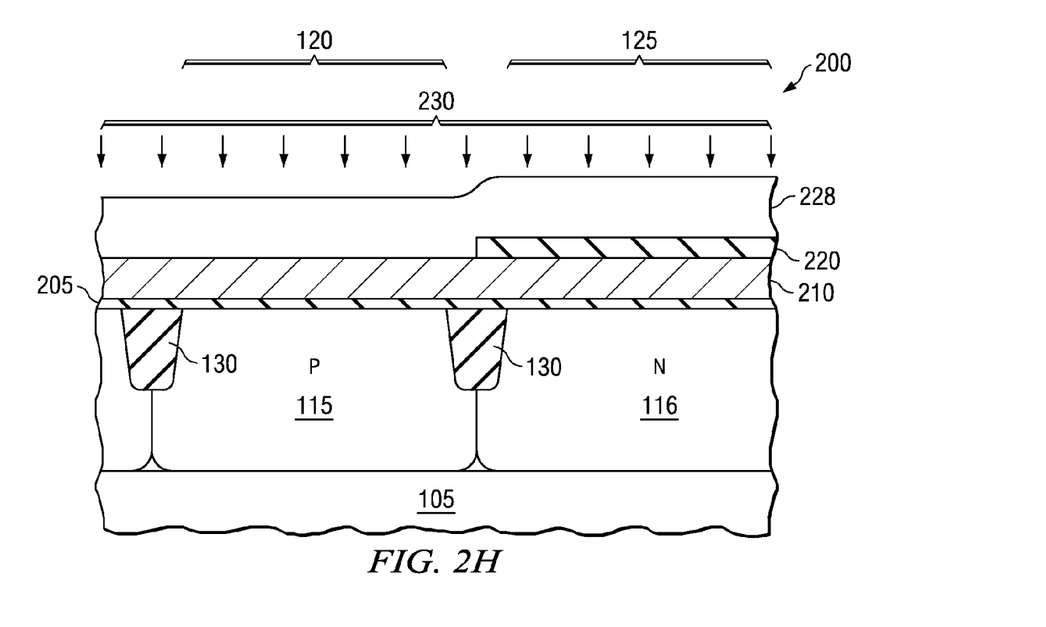

Following the hydrogen anneal 215 clean, a layer 228, such as a polysilicon layer, may be deposited over the device, as seen in FIG. 2H. In this embodiment, the layer 228 may be comprised of conventional materials and conventional processes may be used to deposit the layer 228. As will be seen below, the layer 228 is used to further form the gate electrode over the nMOS region 120. Also, if required, the layer 228 may undergo an optional doping process 230 that can be used to further adjust the work function in the nMOS region 120.

The barrier layer 220 in the pMOS region 125 prevents the dopants from diffusing into the metallic layer 210 in the pMOS region 125. Conventional processes and materials may also be used to conduct the doping process 230. The doping process 230 may be used in addition to or in place of the previously discussed doping processes 226 of FIG. 2F.

Figure 2I:
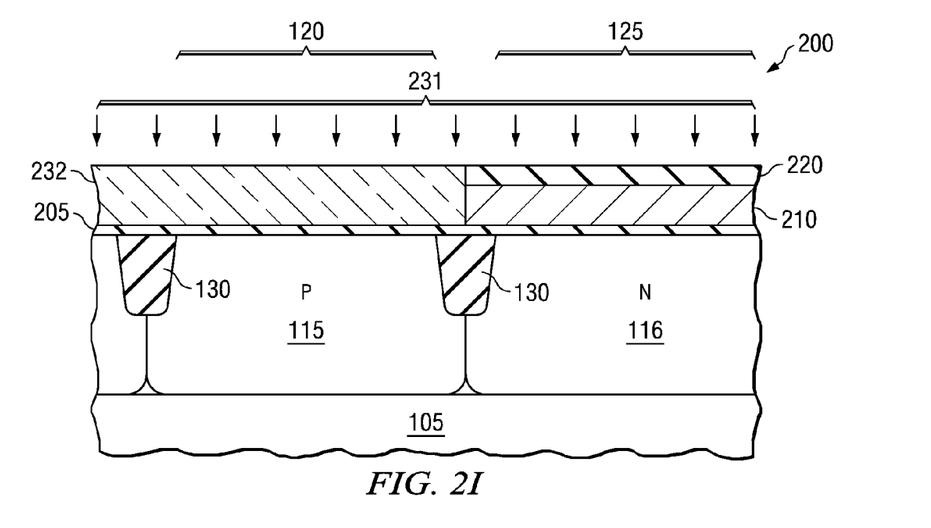

As seen in FIG. 2I, after the doping process 230, a conventional silicide anneal 231 may be conducted on the device 200 of FIG. 2H, which converts the metallic layer 210 in the nMOS region to a metal silicide layer 232. FIG. 2I shows the device 200 following the silicide anneal and removal of the excess layer 228. In the PMOS region 125, the barrier layer 220 protects the metallic layer 210 from the silicidation process, and prevents silicidation from occurring there. This results in the metal silicide layer 232 in the nMOS region 120 and the re-oriented metallic layer 210 and barrier layer 220 stack in the PMOS region 125. By way of the doping processes discussed above, the work function of the metal silicide layer 232 has been adjusted to accommodate an nMOS device, and by way of the microstructure re-orientation, the metallic layer 210 in the PMOS region 125 has been re-oriented to provide the appropriate work function for a PMOS device.

Figure 2J:
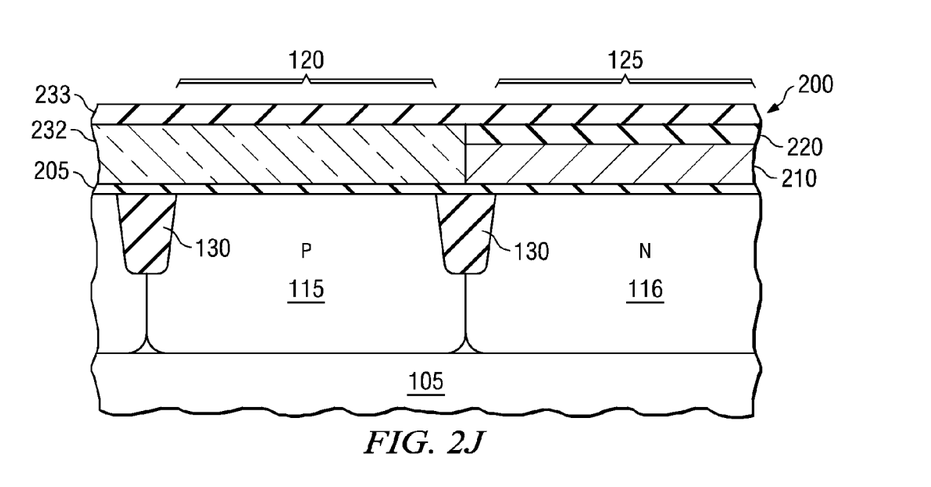

FIG. 2J illustrates an optional embodiment of the semiconductor device 200 of FIG. 2I. In this embodiment, an optional barrier layer 233 has been deposited. This barrier layer 233 may be comprised of conventional materials and may have a similar or different composition than the barrier layer 220. Additionally, conventional processes as those used to deposit barrier layer 220 may be used to deposit the optional barrier layer 233.

Figure 2K:
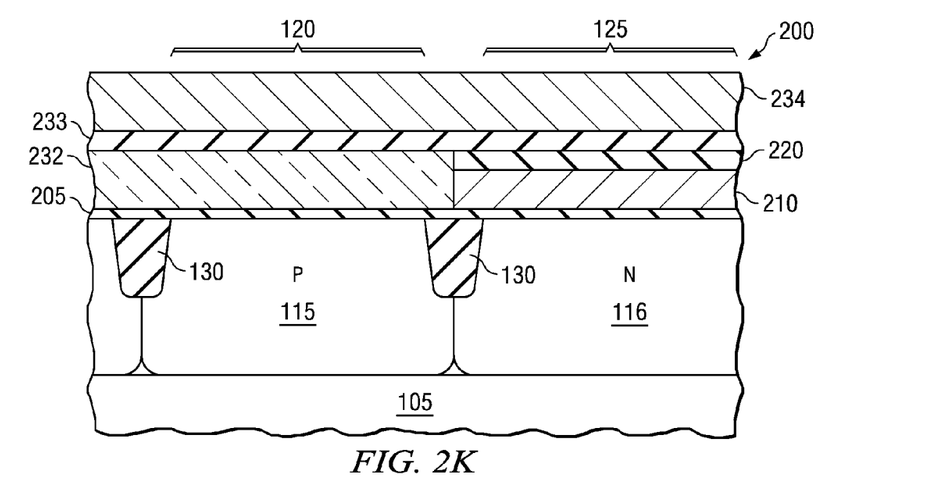
Figure 2L:
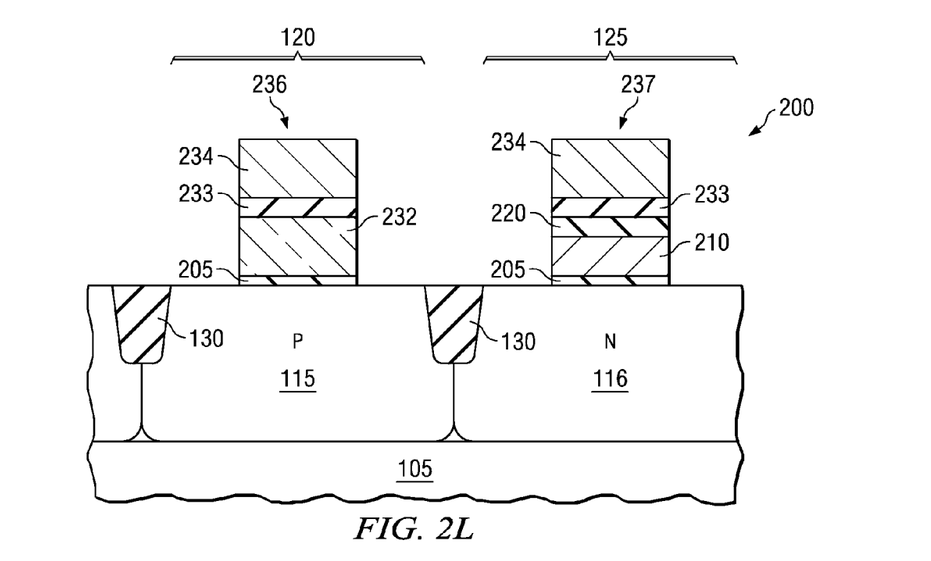

FIG. 2K illustrates, in one embodiment, another layer 234, which may also be a polysilicon, that has been deposited over the metal silicide layer 232 in the nMOS region 120, the barrier layer 220, and re-oriented metallic layer 210 gate stack in the pMOS region 125. As with previous embodiments, the processes and materials used to deposit the layer 234 may be conventional. The layer 234 located over each of the nMOS and pMOS regions 120 and 125 may then be conventionally patterned and appropriately doped to arrive at the nMOS and pMOS gate structures 236 and 237, respectively, as seen in FIG. 2L. At this point, conventional processes may be used to complete the semiconductor device 200 to arrive at the device 100 shown in FIG. 1.

Figure 3A:
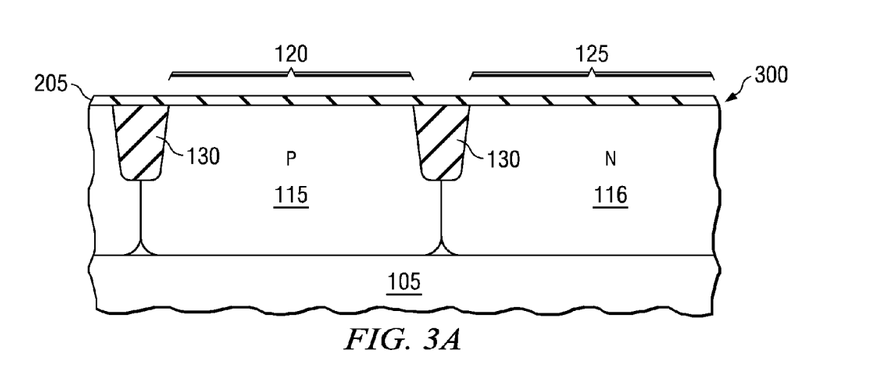
FIGS. 3A-3J illustrate another embodiment of a semiconductor device at various stages of manufacture, as provided by the invention.

FIGS. 3A through 3J illustrate another method embodiment covered by the invention. In many instances, the same components, as those in the previous embodiments, are present and are numbered similarly. FIG. 3A illustrates a semiconductor device 300 that includes the substrate 105, wells 115 and 116, isolation structures 130, dielectric layer 205 and nMOS region 120 and pMOS region 125.

Figure 3B:
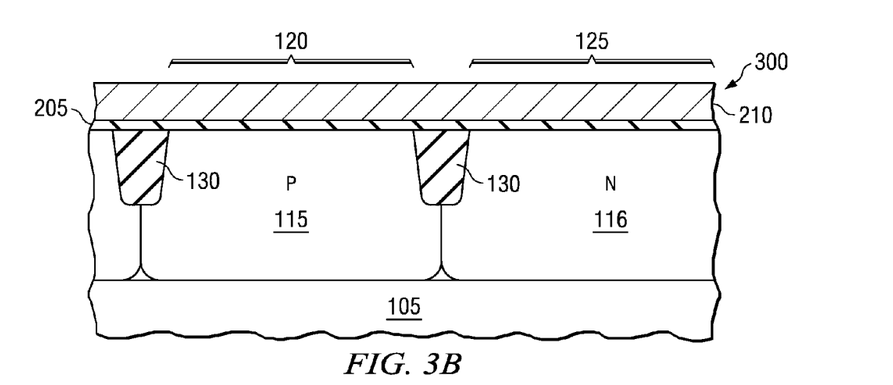

As with previous embodiments, the metallic layer 210 is deposited over the substrate 105, which is shown in FIG. 3B. The same process and materials discussed above may be used to form the metallic layer 210. In this embodiment, the metallic layer 210 serves the same purpose and is deposited over both the nMOS and pMOS regions 120 and 125.

Figure 3C:
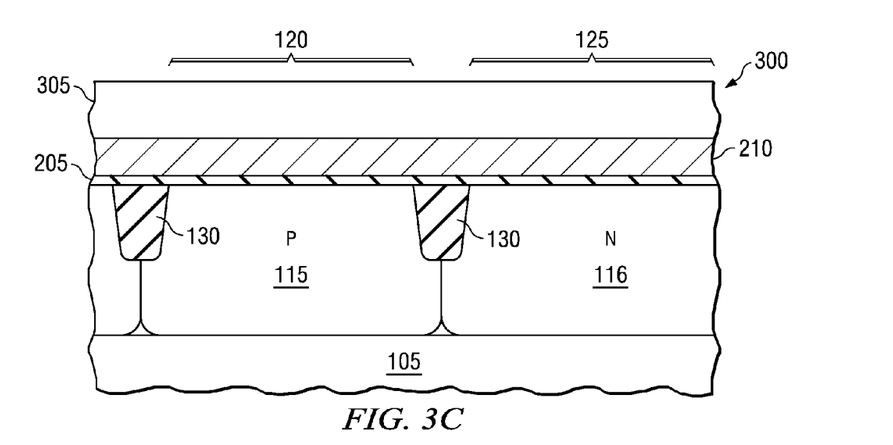

In the embodiment shown in FIG. 3C, a layer 305 is deposited over the metallic layer 210. It should be noted that here the metallic layer 210 has not undergone any microstructure re-orientation as with previous embodiments. The layer 305 may be deposited using conventional processes and materials, and it may be conventionally doped at this point, so that the work function of the metallic layer 210 within the nMOS region 120 may be adjusted at a later point in the manufacturing process.

In one embodiment, the layer 305 may be polysilicon. However, the deposition should be conducted at a low temperature, such as about 500° C. or below to prevent premature reaction with the metallic layer 210. Also, the deposition of the layer 305 may be clustered (i.e., no air break) with the deposition of the metallic layer 210 to avoid oxidation of the metallic layer 210. In such instances, a hydrogen anneal clean is not necessary at this point.

Figure 3D:
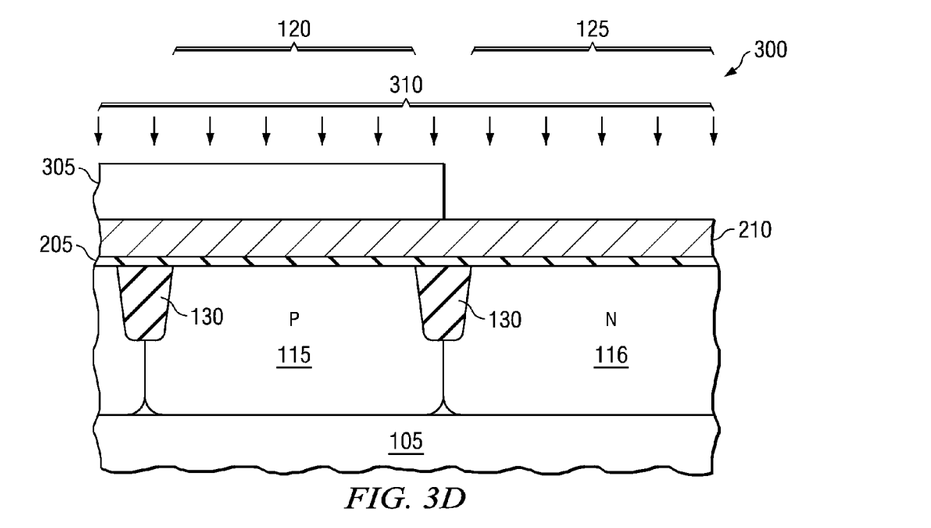

In certain embodiments, it may not be advantageous to re-orient the metallic layer 210 in both the nMOS and pMOS regions 120 and 125, as with the embodiments of FIGS. 2A-2K. Thus, the embodiment illustrated in FIG. 3D may be used to re-orient that portion of the metallic layer 210 that lies within the pMOS region 125. In such embodiments, the layer 305 may be patterned, as shown in FIG. 3D, by using conventional processes. The patterned layer 305 not only provides a source of silicon with which to later silicide the metallic layer 210 in the nMOS region 120, but it also exposes the metallic layer 210 in the PMOS region 125 to an optional hydrogen anneal process 310. If the hydrogen anneal 310 is conducted at this point, the patterned layer 305 prevents the hydrogen anneal 310 from re-orienting the microstructure of the metallic layer 210 in the nMOS region 120 and at the same time allows the metallic layer 210 in the pMOS region 125 to be re-oriented. The hydrogen anneal 310 may be identical to the ones previously described, and it may be conducted in such a manner as to clean the surface of the metallic layer 210, as described above. However, in another embodiment, which is the one that will be discussed moving forward, the optional hydrogen anneal 310 is not conducted at this point, but is conducted at a later point in the manufacturing process.

Figure 3E:
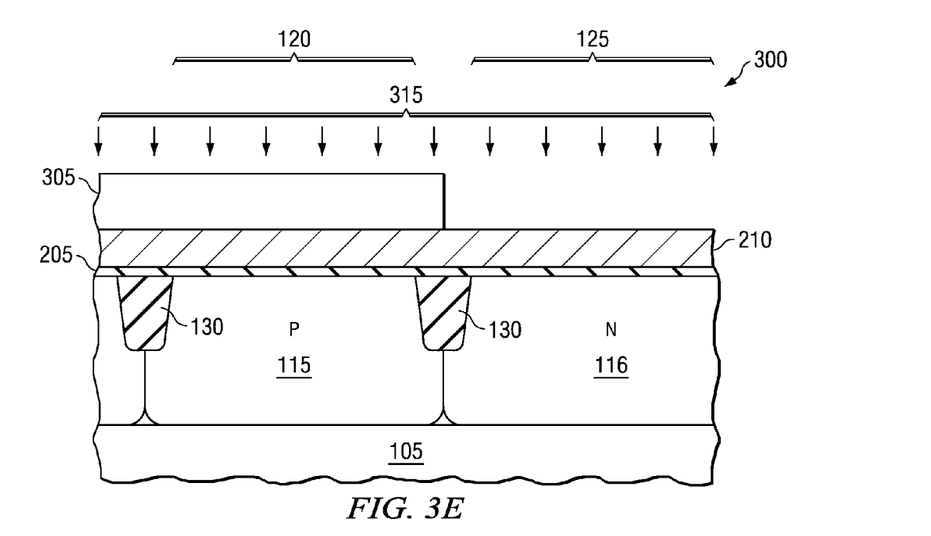
Figure 3F:
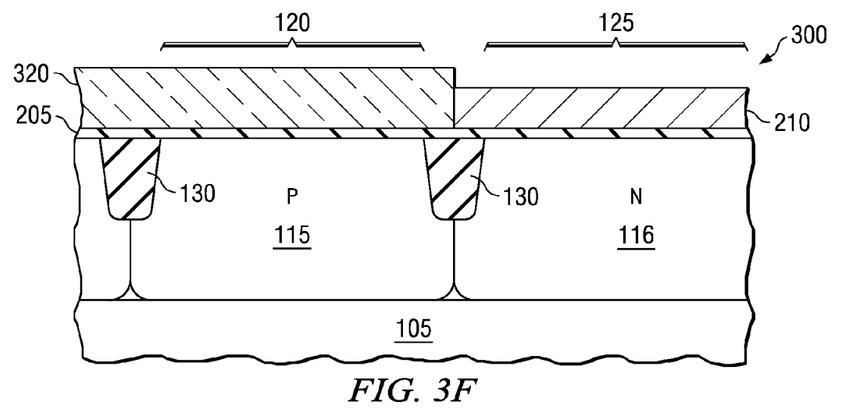

FIG. 3E illustrates the semiconductor device 300 undergoing a silicidation anneal 315. The silicidation anneal may be conventional and may be conducted at temperatures ranging from about 500° C. to about 900° C., and it is used to convert the metallic layer 210 in the nMOS region 120 into a metal silicide 320, as shown in FIG. 3F after the removal of excess silicon that was not reacted during the silicidation anneal. Since the layer 305 is not present over the PMOS region 125, the metallic layer 210 in that region does not undergo silicidation.

Figure 3G:
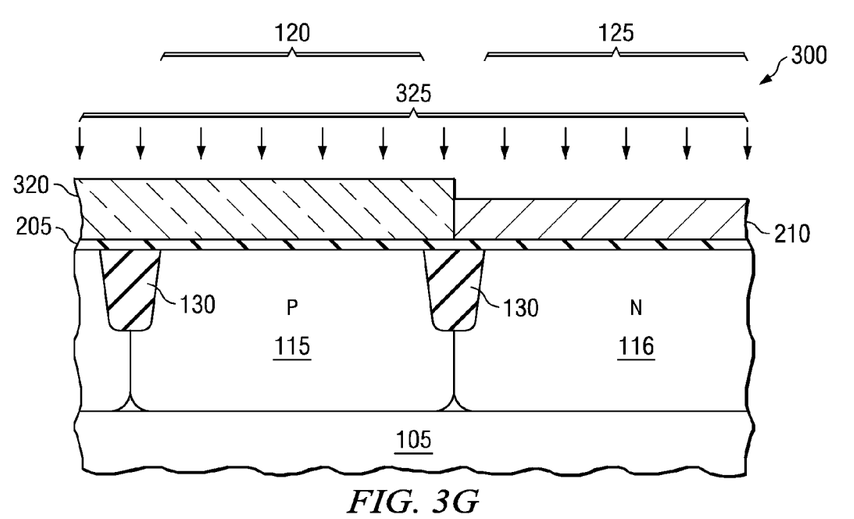

In FIG. 3G, a hydrogen anneal 325 may be conducted to re-orient the metallic layer 210 in the pMOS region 125. The hydrogen anneal 325 may be identical to the embodiments previously discussed, and it may also be used to remove any oxidation or other wise clean the surface of both the metallic layer 210 and the silicide layer 320. This anneal may be conducted even in those embodiments where the optional hydrogen anneal 310 has previously been conducted.

Figure 3H:
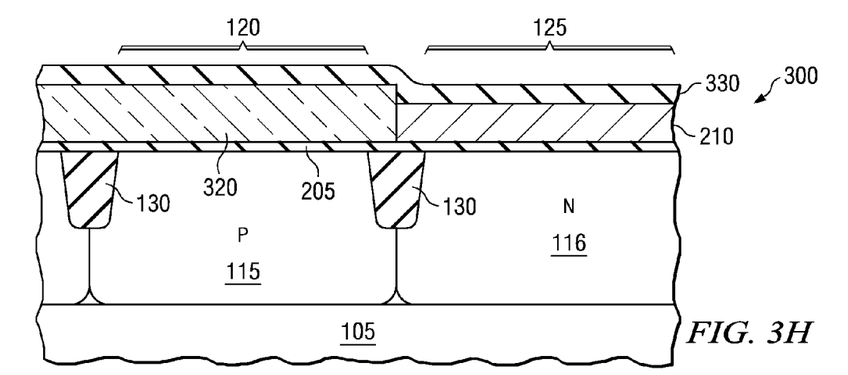

Following the re-orientation of the metallic layer 210 in the pMOS region 125, a barrier layer 330 may be deposited as shown in FIG. 3H. Its purpose is the same as previously discussed in that it should sufficiently protect the re-oriented metallic layer 210 from subsequent manufacturing processes. Additionally, the same processes and materials used in the previous embodiments may also be used here.

Figure 3I:
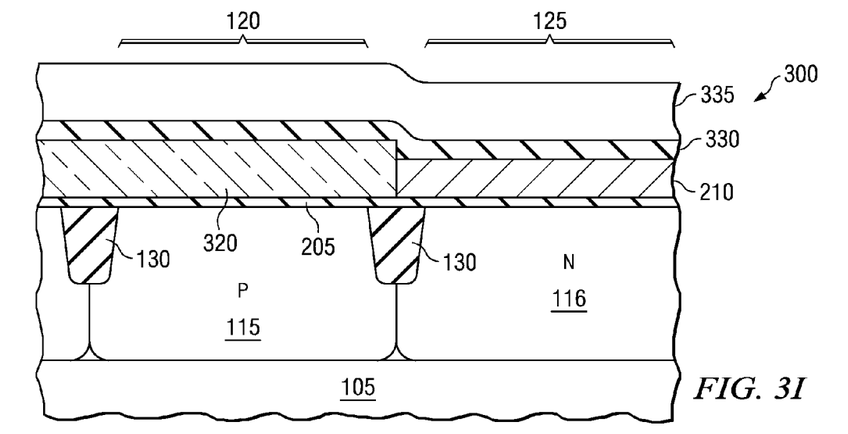
Figure 3J:
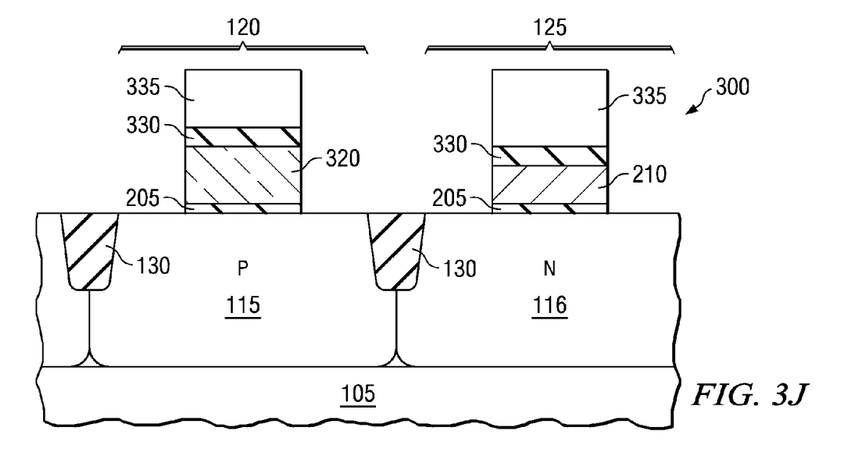

FIG. 3I illustrates the semiconductor device 300 following the deposition of a layer 335, which may also be deposited using conventional processes and materials. For example, in one embodiment, the layer 335 may be a polysilicon layer. As with previous embodiments, well known patterning techniques may be used to pattern and appropriately dope the layer 335 in the nMOS region 120 and pMOS region 125 to arrive at the semiconductor structure shown in FIG. 3J. At this point, conventional processes may be used to complete the device 300 to arrive at the device 100 shown in FIG. 1.

Figure 4:
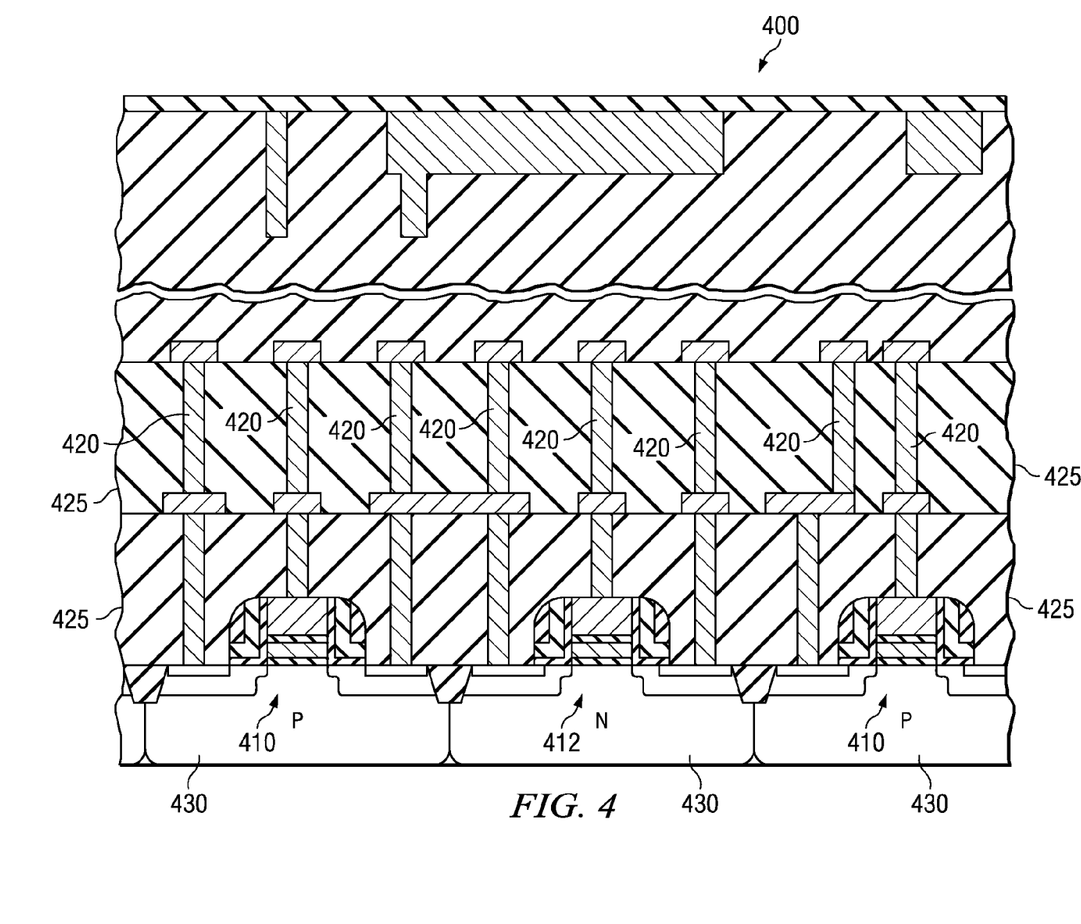
FIG. 4 illustrates an integrated circuit (IC) incorporating devices constructed according to the principles of the invention.

FIG. 4 presents an embodiment where the semiconductor device is configured as an integrated circuit (IC) 400 that may include the semiconductor device 100 of FIG. 1 and the embodiments of FIGS. 2A-2L and 3A-3J. Each of the transistors 410, 412 may comprise the components illustrated in either of the embodiments of FIG. 2A-2L or 3A-3J. The IC 400 also includes interconnects 420 located on or within one or more insulating layers 425 that interconnect the transistors 410, 412 to form an operative integrated circuit 400.

The transistors 410, 412 and other device components can be formed according to any of the embodiments described herein. The work function of the transistor 410 is matched to the conduction band of an nMOS substrate, while the work function of the transistor 412 is matched to valence band of a pMOS substrate. Those who are skilled in the art would understand how to incorporate the semiconductor device of the present invention into an IC as shown in FIG. 4.

Those skilled in the art to which the invention relates will appreciate that other and further additions, deletions, substitutions, and modifications may be made to the described example embodiments, without departing from the invention.

What is claimed is:

1. A process for manufacturing a semiconductor device, comprising:
    placing a metallic gate layer over a gate dielectric layer, the metallic gate layer having a crystallographic orientation; and
    re-orienting the crystallographic orientation of the metallic gate layer by subjecting the metallic gate layer to a hydrogen anneal;
    wherein the semiconductor device comprises a pMOS region and an nMOS region and the crystallographic orientation of the surface of the metallic gate layer is re-oriented over the pMOS region; and
    further comprising converting the metallic gate layer over the nMOS region to a metal silicide prior to re-orienting the metallic gate layer over the pMOS region.

2. The process recited in claim 1, wherein the metal gate layer in the pMOS region after the subjecting has a <110> grain orientation.

3. A process for manufacturing a semiconductor device, comprising:
    placing a metallic gate layer over a gate dielectric layer, the metallic a crystallographic orientation; and
    re-orienting the crystallographic orientation of the metallic gate layer by subjecting the metallic gate layer to a hydrogen anneal;
    wherein the semiconductor device comprises a pMOS region and an nMOS region and the crystallographic orientation of the surface of the metallic gate layer is re-oriented over the MOS region; and
    further comprising converting the metallic gate layer over the nMOS region to a metal silicide subsequent to re-orienting the metallic gate layer over the pMOS region.

* * * * *